United States Patent
Palanki et al.

(10) Patent No.: US 7,543,197 B2
(45) Date of Patent: Jun. 2, 2009

(54) PRUNED BIT-REVERSAL INTERLEAVER

(75) Inventors: Ravi Palanki, San Diego, CA (US); Aamod Khandekar, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 321 days.

(21) Appl. No.: 11/022,485

(22) Filed: Dec. 22, 2004

(65) Prior Publication Data

US 2006/0156199 A1    Jul. 13, 2006

(51) Int. Cl.
G06F 11/00   (2006.01)
H03M 13/03   (2006.01)

(52) U.S. Cl. .................... 714/701; 714/786

(58) Field of Classification Search ............ 714/755, 714/701, 786, 746
See application file for complete search history.

(56) References Cited

U.S. PATENT DOCUMENTS

| | | | | |
|---|---|---|---|---|
| 6,304,991 B1 * | 10/2001 | Rowitch et al. | ............. | 714/755 |
| 6,493,815 B1 * | 12/2002 | Kim et al. | ............. | 711/217 |
| 6,625,762 B1 * | 9/2003 | Le Dantec | ............. | 714/701 |
| 6,636,568 B2 | 10/2003 | Kadous | | |
| 6,845,482 B2 * | 1/2005 | Yao et al. | ............. | 714/755 |
| 7,170,849 B1 * | 1/2007 | Arivoli et al. | ............. | 370/208 |

FOREIGN PATENT DOCUMENTS

| | | |
|---|---|---|
| EP | 1 335 497 | 8/2003 |
| EP | 1 587 217 | 10/2005 |
| KR | 2003-0067557 | 8/2003 |
| KR | 2004-0053055 | 6/2004 |
| WO | 2006055718 | 5/2006 |

OTHER PUBLICATIONS

Brian Eidson, "IEEE 802.16 Broadband Wireless Access Working Group: Addendum to Recirculation Ballot #13a Editorial Comments," (Dec. 29, 2003) Internet Article Retrieved from the internet: URL: <http://www.ieee802.org/16/tgd/contrib/c80216d-03_90.prf> on May 11, 2006.

(Continued)

*Primary Examiner*—Shelly A Chase
(74) *Attorney, Agent, or Firm*—Sandip S. Minhas; Stanton Braden

(57) ABSTRACT

A pruned bit-reversal interleaver supports different packet sizes and variable code rates and provides good spreading and puncturing properties. To interleave data, a packet of input data of a first size is received. The packet is extended to a second size that is a power of two, e.g., by appending padding or properly generating write addresses. The extended packet is interleaved in accordance with a bit-reversal interleaver of the second size, which reorders the bits in the extended packet based on their indices. A packet of interleaved data is formed by pruning the output of the bit-reversal interleaver, e.g., by removing the padding or properly generating read addresses. The pruned bit-reversal interleaver may be used in combination with various types of FEC codes such as a Turbo code, a convolutional code, or a low density parity check (LDPC) code.

18 Claims, 6 Drawing Sheets

OTHER PUBLICATIONS

Ampadu and Komegay, "An Efficient Hardware Interleaver for 3G Turbo Decoding," IEEE Radio and Wireless Conference Proceedings, Aug. 10-13, pp. 199-201 (2003).

Pauluzzi, David R. and Beaulieu, Norman C. "A Comparison of SNR Estimation Techniques for the AWGN Channel" vol. 48, No. 10, Oct. 2000.

International Search Report—PCT/US2005/047623, International Search Authority- European Patent Office—May 24, 2006.

International Preliminary Report on Patentability—PCT/US2005/047623, International Search Authority—The International Bureau of WIPO- Geneva, Switzerland- Jun. 26, 2007.

Written Opinion—PCT/US2005/047623, International Search Authority—European patent Office- May 24, 2006.

* cited by examiner

Coded Packet

| $b_0$ | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ | $b_{13}$ | $b_{14}$ | $b_{15}$ |
|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 |

Bit Index →

4-Bit Reversal Interleaver

Interleaved Packet

| $b_0$ | $b_8$ | $b_4$ | $b_{12}$ | $b_2$ | $b_{10}$ | $b_6$ | $b_{14}$ | $b_1$ | $b_9$ | $b_5$ | $b_{13}$ | $b_3$ | $b_{11}$ | $b_7$ | $b_{15}$ |
|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 |

Bit Index →

PRUNED BIT-REVERSAL INTERLEAVER

BACKGROUND

I. Field

The present invention relates generally to communication, and more specifically to techniques for interleaving data in a communication system.

II. Background

In a communication system, a transmitter typically encodes a packet of traffic data to generate a packet of code bits, interleaves or reorders the code bits, and modulates the interleaved bits to generate modulation symbols. The transmitter then processes and transmits the modulation symbols via a communication channel. The data transmission is degraded by impairments in the communication channel, such as thermal noise, interference, spurious signals, and so on. A receiver obtains a distorted version of the transmitted modulation symbols.

Encoding and interleaving allow the receiver to recover the transmitted traffic data in the presence of degradations in the received symbols. The encoding may include error detection coding that allows the receiver to detect for errors in the received traffic data and/or forward error correction (FEC) coding that allows the receiver to correct for errors in the received traffic data. FEC coding generates redundancy in the coded packet. This redundancy allows the receiver to recover the transmitted traffic data even if some errors are encountered during transmission. The interleaving reorders or shuffles the code bits in the packet so that code bits that are near each other are separated in time, frequency, and/or space during transmission. If a burst of errors occurs during transmission, then these errors are spread apart after the de-interleaving at the receiver, which improves decoding performance.

An interleaver is often designed to achieve good performance for packets of a particular size. (The term "size" and "length" are synonymous and are used interchangeably herein.) If the communication system supports multiple packet sizes, then a different interleaver is often designed and used for each packet size. The use of multiple interleavers for different packet sizes can complicate the interleaving at the transmitter and the de-interleaving at the receiver, especially if the system supports a wide range of packet sizes.

There is therefore a need in the art for techniques to efficiently perform interleaving for packets of different sizes.

SUMMARY

Techniques for interleaving packets of different sizes using a pruned bit-reversal interleaver are described herein. A bit-reversal interleaver takes in a packet of $N_{br}$ input bits and reorders these bits based on their indices such that the bit at index i in the input packet is placed at index j in an interleaved packet, where j is a bit-reversed value of i. The bit-reversal interleaver operates on packet sizes that are powers of two. The pruned bit-reversal interleaver takes in a packet of N input bits and reorders these bits based on their indices, similar to the bit-reversal interleaver. However, N may be any value and is not restricted to powers of two. The pruned bit-reversal interleaver supports different packet sizes and variable code rates and further provides good spreading and puncturing properties, which can improve decoding performance as described below.

In an embodiment for interleaving data, a packet of input data of a first size is received. The packet is extended to a second size that is a power of two, e.g., by appending padding to the packet or by properly generating addresses for writing the packet to a memory. The extended packet is interleaved in accordance with a bit-reversal interleaver of the second size. A packet of interleaved data is then formed by pruning the output of the bit-reversal interleaver, e.g., by removing the padding or by properly generating addresses for reading the packet from the memory.

The pruned bit-reversal interleaver may be used in combination with various types of FEC codes such as a Turbo code, a convolutional code, a low density parity check (LDPC) code, and so on. The pruned interleaving techniques may also be extended to other types of interleaver such as, for example, a linear congruential sequence (LCS) interleaver, a pseudo-random interleaver, and so on. For these other types of interleaver, the interleaver size may or may not be powers of two.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

FIG. 3 illustrates the operation of a 4-bit reversal interleaver.

FIG. 4 illustrates the operation of a 4-bit pruned reversal interleaver.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Communication systems are widely deployed to provide various communication services such as voice, packet data, and so on. These systems may be time, frequency, and/or code division multiple-access systems capable of supporting communication with multiple users simultaneously by sharing the available system resources. Examples of such multiple-access systems include Code Division Multiple Access (CDMA) systems, Multiple-Carrier CDMA (MC-CDMA), Wideband CDMA (W-CDMA), High-Speed Downlink Packet Access (HSDPA), Time Division Multiple Access (TDMA) systems, Frequency Division Multiple Access (FDMA) systems, and Orthogonal Frequency Division Multiple Access (OFDMA) systems.

Figure 1:
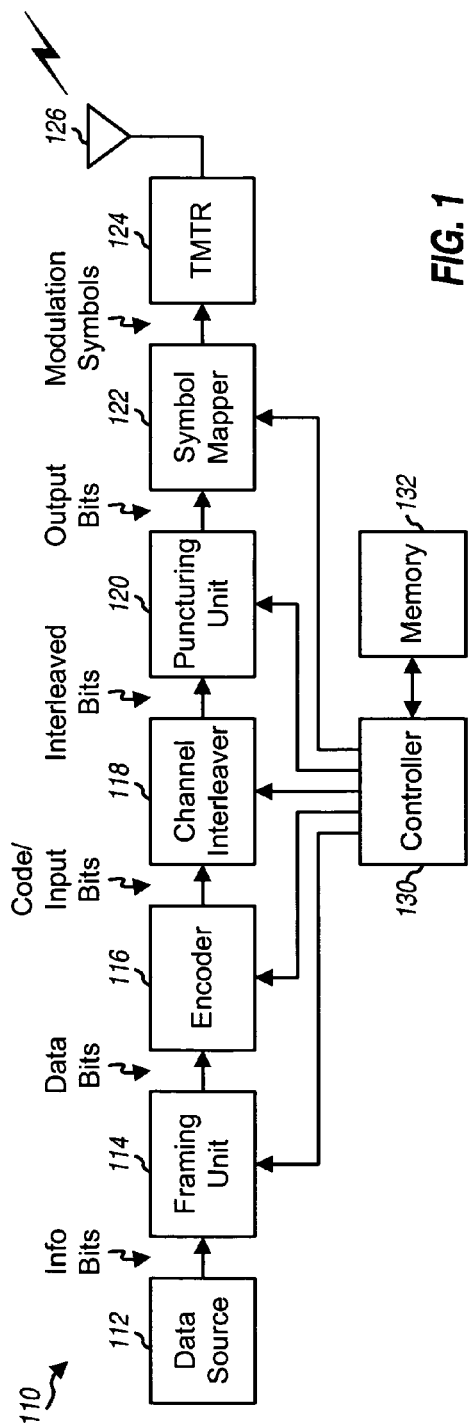
FIG. 1 shows a block diagram of a transmitter.

FIG. 1 shows a block diagram of an embodiment of a transmitter 110 in a wireless communication system. At transmitter 110, a framing unit 114 receives traffic data (or information bits) from a data source 112, forms packets of information bits, and formats each information packet to generate a corresponding data packet. The formatting for each packet may include, for example, (1) generating a cyclic redundancy check (CRC) value for the information bits, (2) appending the CRC value, header, padding, tail bits, and so on to the information bits, and (3) scrambling all of the bits with a scrambling code to generate the data packet. An encoder 116 encodes each data packet in accordance with a coding scheme and provides a corresponding coded packet. The coding scheme may comprise a Turbo code, a convolutional code, an LDPC code, an irregular repeat-accumulate (IRA) code (which may be considered as a class of LDPC codes), a block code, some other FEC code, or a combination thereof. The encoding generates redundancy in the coded packet, which increases the reliability of data transmission.

A channel interleaver 118 interleaves (i.e., reorders or shuffles) the code bits in each coded packet based on an interleaving scheme and provides a corresponding interleaved packet. The interleaving provides time, frequency, and/or spatial diversity for the coded packet and may be performed as described below. A puncturing unit 120 punctures (i.e., deletes) zero or more bits in each interleaved packet to obtain the desired number of bits for the packet. Encoder 116 may implement a base code that generates $N_C$ code bits for $N_D$ data bits in a packet, where $N_D \geq 1$ and $N_C$ is dependent on $N_D$ and the code rate of the base code. For example, if the base code has a rate of $R_{base}=1/5$, then encoder 116 generates five code bits for each data bit, and $N_C=5N_D$. If $N_T$ code bits are to be transmitted for the packet, where $N_T<N_C$, then puncturing unit 120 deletes $N_C-N_T$ code bits and provides the remaining $N_T$ code bits for the packet. The actual code rate for the packet is then $R=N_D/N_T$, which is higher than the base code rate of $R_{base}=1/5$. Puncturing unit 120 provides an output packet containing the unpunctured bits in each interleaved packet.

A symbol mapper 122 maps the bits in each output packet in accordance with a modulation scheme and provides modulation symbols. The symbol mapping may be achieved by (1) grouping sets of B bits to form B-bit binary values, where $B \geq 1$, and (2) mapping each B-bit binary value to a point in a signal constellation for the selected modulation scheme. Each modulation symbol is a complex value corresponding to a mapped signal point for a set of B bits. Symbol mapper 122 provides a packet of modulation symbols for each output packet.

A transmitter unit (TMTR) 124 processes the modulation symbols in accordance with the design of the system and generates data samples. For example, transmitter unit 124 may perform orthogonal frequency division multiplexing (OFDM) modulation, spectral spreading, and so on. Transmitter unit 124 further conditions (e.g., converts to analog, filters, amplifies, and frequency upconverts) the data samples to generate a modulated signal, which is transmitted via an antenna 126.

A controller 130 controls the operation of various processing units at transmitter 110. For example, controller 130 may select a particular format to use for each data packet. The selected format may be associated with various parameters for the data packet such as, for example, the size of the packet, the coding scheme or code rate to use for the packet, the modulation scheme to use for the packet, and so on. Controller 130 may then generate various controls for framing unit 114, encoder 116, channel interleaver 118, puncturing unit 120, and symbol demapper 122 based on the selected format for each packet. A memory unit 132 stores program codes and data used by controller 130.

Figure 2:
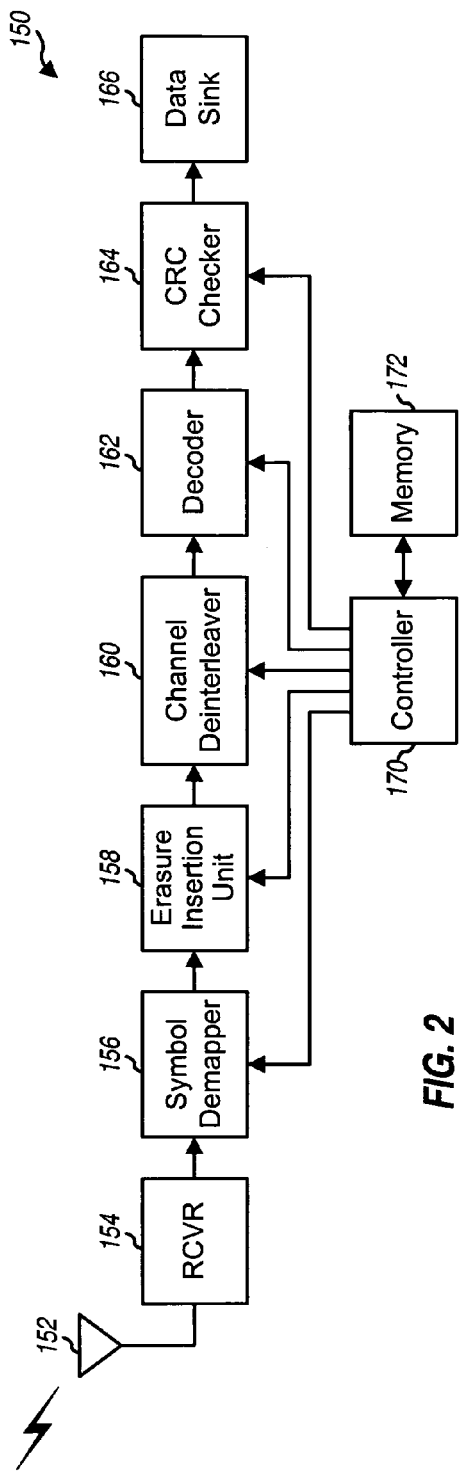
FIG. 2 shows a block diagram of a receiver.

FIG. 2 shows a block diagram of an embodiment of a receiver 150 in the system. At receiver 150, an antenna 152 receives the transmitted signal from transmitter 110 and provides a received signal to a receiver unit (RCVR) 154. Receiver unit 154 processes the received signal in a manner complementary to the processing performed by transmitter unit 124 and provides received symbols. A symbol demapper 156 demodulates the received symbols for each packet in accordance with the modulation scheme used for the packet and provides a packet of demodulated data. An erasure insertion unit 158 inserts erasures for the punctured code bits in each packet. Erasures are dummy values that are given appropriate weight in the decoding process.

A channel deinterleaver 160 deinterleaves the demodulated data in each packet in a manner complementary to the interleaving performed by channel interleaver 118 and provides a packet of deinterleaved data. A decoder 162 decodes each packet of deinterleaved data and provides a packet of decoded data to CRC checker 164. Decoder 162 performs decoding in a manner complementary to the encoding performed by encoder 116. For example, decoder 162 may be a Turbo decoder if encoder 116 performs Turbo encoding, a Viterbi decoder if encoder 116 performs convolutional encoding, or an LDPC decoder if encoder 116 performs LDPC encoding. CRC checker 164 checks each decoded packet based on the appended CRC value and determines whether the packet was decoded correctly or in error. CRC checker 164 provides correctly decoded packets to a data sink 166.

Controller 170 controls the operation of various processing units at receiver 150. For example, controller 170 may be informed of the format for each packet and may generate the appropriate controls for symbol demapper 156, erasure insertion unit 158, channel deinterleaver 160, and decoder 162. Memory unit 172 stores program codes and data used by controller 170.

At transmitter 110 in FIG. 1, channel interleaver 118 reorders the code bits in each coded packet such that bit errors encountered by receiver 150 for the packet are distributed across the packet after the complementary deinterleaving by channel deinterleaver 160. Good distribution of bit errors can improve decoding performance, and hence data transmission performance.

Channel interleaver 118 should provide the following:
1. Good spreading property so that code bits that are close to each other before channel interleaving are spaced far apart after the channel interleaving; and
2. Regular or approximately regular puncturing patterns so that evenly spaced code bits from encoder 116 are selected for transmission.

Good spreading property can provide more diversity to combat deleterious path effects such as fading, multipath, interference, and so on. Regular or approximately regular puncturing patterns can improve performance for some coding schemes. A regular puncturing pattern selects evenly spaced bits (e.g., every k-th bits) in a sequence for transmission. An irregular puncturing pattern, such as a pseudo-random puncturing pattern, selects bits that are not uniformly spaced in a sequence for transmission. Some coding schemes such as Turbo codes can provide better performance when used in combination with regular puncturing patterns instead of irregular (e.g., pseudo-random) puncturing patterns.

In an embodiment, channel interleaver 118 is implemented as a pruned bit-reversal interleaver that can provide both of the desired properties described above for different packet sizes and code rates. A pruned bit-reversal interleaver is based on a conventional bit-reversal interleaver that takes in a packet of $N_{br}$ code bits and reorders these code bits based on their indices, as described below. The bit-reversal interleaver provides the two properties described above but only operates on packet sizes that are powers of two, so that $N_{br}=2^L$, where L is a positive integer value. A pruned bit-reversal interleaver takes in a packet of N code bits and reorders these code bits based on their indices, where N may be any integer value and is not restricted to powers of two. The pruned bit-reversal interleaver also has the two properties described above.

FIG. 3 illustrates the operation of a 4-bit reversal interleaver on a coded packet with 16 code bits. The 16 bit positions within the coded packet are given indices of 0 through 15. The 16 code bits in the coded packet are denoted as $b_0, b_1, b_2, \ldots, b_{15}$, where code bit $b_i$ is at bit index i in the coded packet.

The bit-reversal interleaving scheme operates as follows. For each code bit $b_i$, where i=0, 1, . . . 15, bit index i of code bit $b_i$ is expressed in binary form using four binary bits. The four binary bits are then reversed so that the first, second, third and fourth binary bits for index i are moved to the fourth, third, second and first bit positions, respectively. The four reversed bits form a bit-reversed value of $j=\pi(i)$, where $\pi(i)$ denotes the bit reversal operation on the binary representation of i. Code bit $b_i$ is then provided at bit index j in the interleaved packet. For example, bit index i=3 is expressed in binary form as '0011', the reversed bits are '1100', and the bit-reversed value is j=12. Code bit $b_3$ in the coded packet is then mapped to bit index 12 in the interleaved packet. FIG. 3 shows the mapping of the 16 code bits in the coded packet to the 16 bit positions in the interleaved packet.

An L-bit reversal interleaver satisfies the following spreading property:

$$\text{If } |a-b|<2^k, \text{ then } |\pi(a)-\pi(b)|\geq 2^{L-k-1}, \quad\quad \text{Eq (1)}$$

where
 a and b are any two bit indices for the coded packet;
 $|a-b|$ denotes the distance between bit indices a and b;
 $\pi(a)$ is the bit-reversed value for bit index a; and
 $\pi(b)$ is the bit-reversed value for bit index b.

Equation (1) indicates that if bit indices a and b differ in at least one of their k least significant bits, then $\pi(a)$ and $\pi(b)$ differ in at least one of their k most significant bits. Thus, if two code bits are separated by less than $2^k$ bit positions in the coded packet, then these two code bits are separated by at least $2^{L-k-1}$ bit positions in the interleaved packet. For example, if L=10 and k=2, then code bits that are less than four bit positions away from each other in the coded packet are separated by at least 128 bit positions in the interleaved packet.

The L-bit reversal interleaver provides regular or approximately regular puncturing patterns. After the interleaving, the first $N_{br}/2$ code bits in the interleaved packet are those with indices divisible by 2. Similarly, the first $N_{br}/4$ code bits in the interleaved packet have indices divisible by 4, the first $N_{br}/8$ code bits have indices divisible by 8, and so on. If the code bits in the interleaved packet are subsequently punctured, then puncturing all but the first $N_{br}/2$ code bits would result in transmission of code bits that are spaced apart by two in the coded packet. In general, puncturing all but the first $N_{br}/2^k$ code bits in the interleaved packet would result in transmission of code bits that are spaced apart by $2^k$ in the coded packet. Thus, regular puncturing patterns may be achieved when the "puncturing factor" is a power of two, or $2^k$, and only $N_{br}/2^k$ code bits are retained among the $N_{br}$ total code bits in the coded packet. For other puncturing factors that are not powers of two, approximately regular puncturing patterns are achieved with the bit-reversal interleaver.

Figure 4:
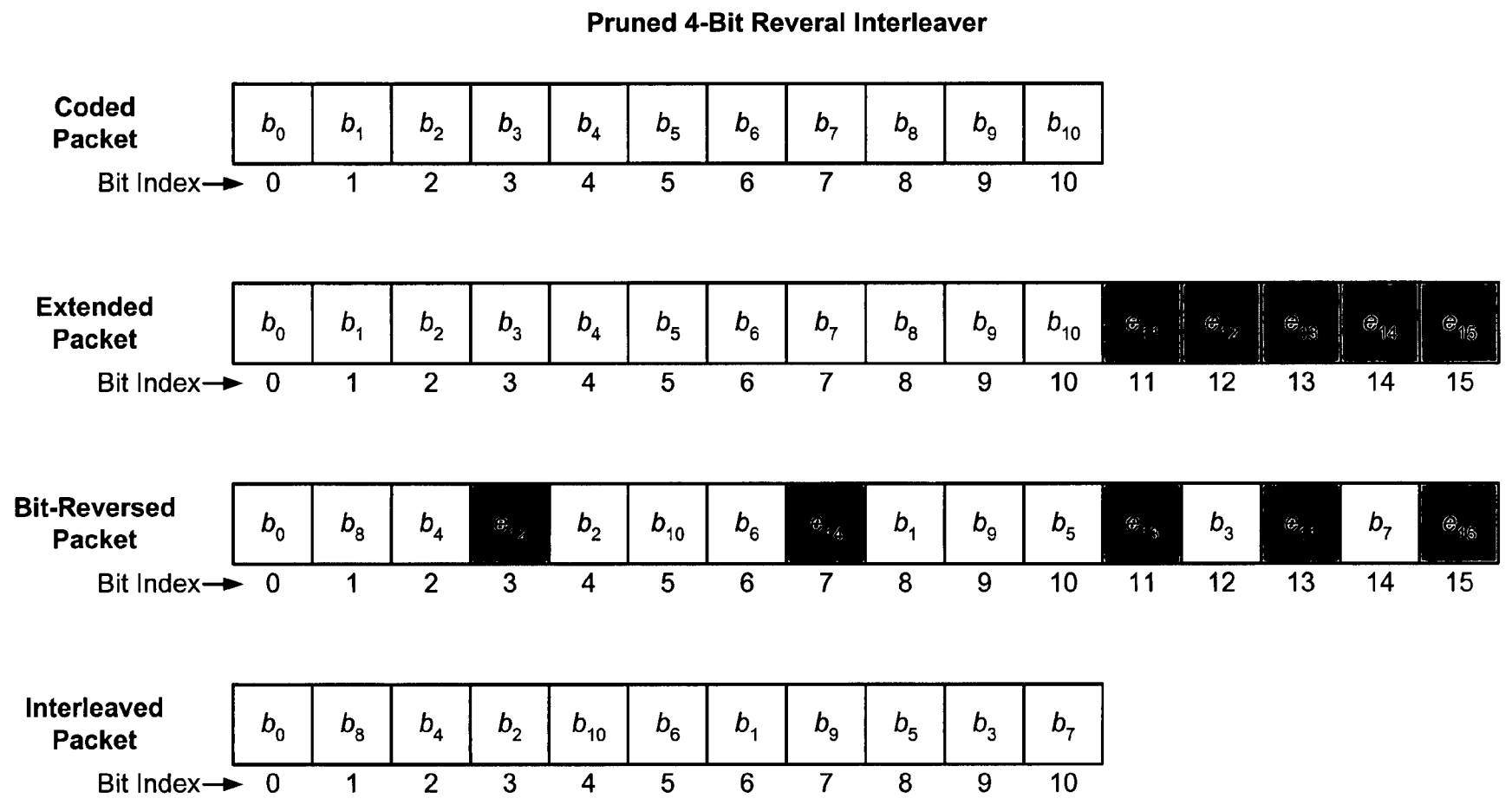

FIG. 4 illustrates the operation of a pruned 4-bit reversal interleaver on a coded packet with 11 code bits. The 11 bit positions within the coded packet are given indices of 0 through 10. The 11 code bits in the coded packet are denoted as $b_0, b_1, b_2, \ldots, b_{10}$, where code bit $b_i$ is at bit index i in the coded packet.

The pruned bit-reversal interleaving scheme operates as follows. The coded packet is extended to length 16, which is the nearest power of two that is greater than the coded packet size of 11. The packet extension may be achieved by appending five padding bits, which are denoted as $e_{11}, e_{12}, \ldots, e_{15}$, at the end of the 11 coded bits to form an extended packet with 16 bits. Normal 4-bit reversal interleaving is then performed on the bits in the extended packet, as described above for FIG. 3, to obtain a bit-reversed packet. Thus, bit $b_i$ at index i in the extended packet is mapped to bit index j in the bit-reversed packet, where $j=\pi(i)$ and $\pi(i)$ denotes the bit reversal operation on i. The five padding bits in the bit-reversed packet are then deleted to obtain an interleaved packet containing the 11 coded bits.

A pruned (L+1)-bit reversal interleaver satisfies the following spreading property:

$$\text{If } |a-b|<2^k, \text{ then } |\pi(a)-\pi(b)|\geq 2^{L-k-1}. \quad\quad \text{Eq (2)}$$

Equation (2) indicates that if two code bits are separated by less than $2^k$ bit positions in the coded packet, then these two code bits are separated by at least $2^{L-k-1}$ bit positions in the interleaved packet. The spreading factors achieved by the pruned bit reversal interleaver are nearly the same as those achieved by the bit-reversal interleaver. The additional advantage of the pruned bit-reversal interleaver is that it may be used for different packet sizes.

The pruned bit reversal interleaver also provides regular or approximately regular puncturing patterns. After the interleaving, the first N/2 code bits in the interleaved packet have indices divisible by 2, the first N/4 code bits in the interleaved packet have indices divisible by 4, the first N/8 code bits have indices divisible by 8, and so on. If the code bits in the interleaved packet are subsequently punctured, then puncturing all but the first $N/2^k$ code bits in the interleaved packet would result in transmission of code bits that are spaced apart by $2^k$ bit positions in the coded packet. Thus, regular puncturing patterns are obtained when the puncturing factor is a power of two and approximately regular puncturing patterns are obtained when the puncturing factor is not a power of two.

Figure 5:
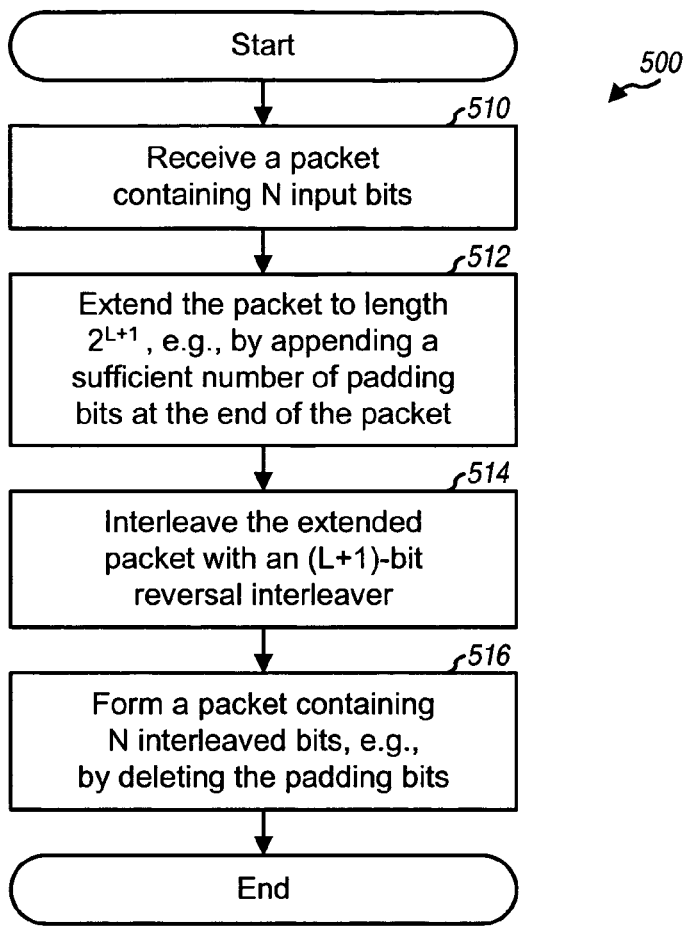
FIG. 5 shows a process for performing pruned bit-reversal interleaving.

FIG. 5 shows a process 500 for performing pruned bit-reversal interleaving. Initially, a packet containing N input bits and having a size of N is received (block 510). If the packet size is not a power of two (i.e., if $2^L<N<2^{L+1}$), then an (L+1)-bit reversal interleaver with pruning is used to interleave the N input bits in the packet. To perform the pruned bit-reversal interleaving, the packet is first extended to length $2^{L+1}$ (block 512). This may be achieved by appending ($2^{L+1}-N$) padding bits at the end of the packet. Alternatively, the packet extension may be achieved by properly generating bit addresses used for interleaving, as described below. In any case, the extended packet of length $2^{L+1}$ is interleaved with an (L+1)-bit reversal interleaver (block 514). A packet containing N interleaved bits is then formed, e.g., by deleting the ($2^{L+1}-N$) padding bits if they were appended to the packet (block 516).

Figure 6:
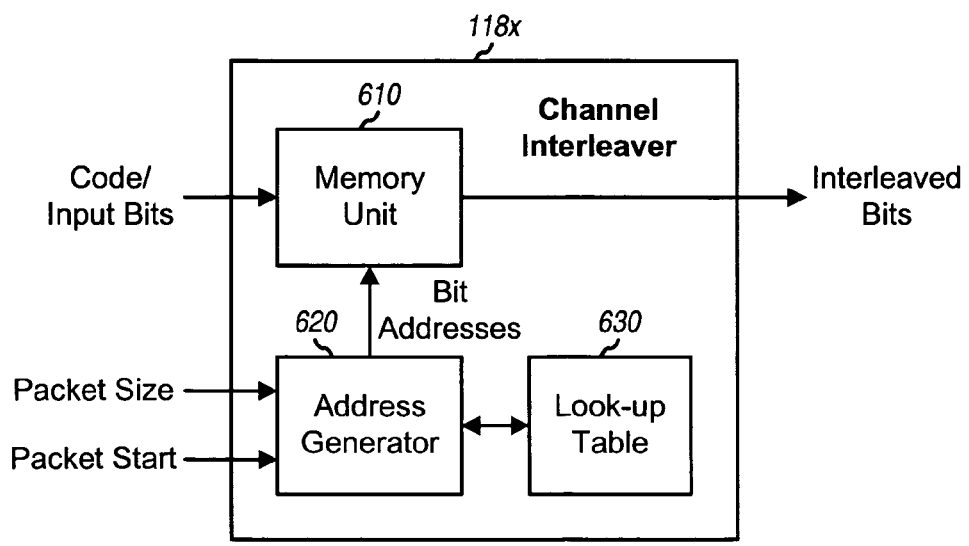
FIG. 6 shows a block diagram of a channel interleaver.

FIG. 6 shows a block diagram of a channel interleaver 118x, which is one embodiment of channel interleaver 118 at transmitter 110 in FIG. 1. Channel interleaver 118x includes a memory unit 610, an address generator 620, and a look-up table 630. Channel interleaver 118x receives input bits (which are code bits from encoder 116) and stores these input bits in memory unit 610 at locations determined by address generator 620. Channel interleaver 118x provides interleaved bits from memory unit 610 at locations determined by address generator 620. Address generator 620 receives an indication of the start of each incoming packet and its size N and generates the proper addresses for writing the input bits into memory unit 610. Address generator 620 also generates the proper addresses for reading or retrieving the interleaved bits from memory unit 610.

The interleaving for the pruned bit reversal interleaver may be performed in several manners. In a first embodiment, the input bits in a packet are stored in a linear order in memory unit 610 and retrieved in an interleaved order from memory unit 610. For this embodiment, address generator 620 receives the start of an incoming packet and generates sequential addresses for the packet. Address generator 620 also generates bit-reversed addresses for reading the interleaved bits from memory unit 610. In a second embodiment, the input bits in a packet are stored in an interleaved order in memory unit 610 and retrieved in a linear order from memory unit 610. For this embodiment, address generator 620 receives the start of an incoming packet and generates bit-reversed addresses for writing the input bits to memory unit 610. Address generator 620 also generates sequential addresses for reading the interleaved bits from memory unit 610.

For both embodiments, address generator 620 can generate the bit-reversed addresses such that padding of the input packet is not needed. The bit-reversed addresses may be generated as follows. The input packet contains N input bits at indices of 0 through N−1. Address generator 620 first determines the required number of bits (L+1) for the bit-reversal interleaver, where (L+1) is the smallest integer such that $N \leq 2^{L+1}$. A counter within address generator 620 is initialized to zero. Address generator 620 then forms a tentative bit-reversed address j as $j=\pi(i)$, where $\pi(i)$ is the bit reversal operation on the current counter value i. The bit-reversed address j is accepted if it is less than N and rejected otherwise. Address generator 620 provides the bit-reversed address j if it is accepted. In either case, the counter is incremented and the new counter value is used to generate the next tentative bit-reversed address. The address generation process continues until all N valid bit-reversed addresses are generated. The padding or packet extension to length $2^{L+1}$ is effectively achieved by properly generating the bit-reversed addresses.

Address generator 620 may generate the bit-reversed addresses on the fly as they are needed to write the input bits into memory unit 610 or to read the interleaved bits from memory unit 610. Alternatively, the bit-reversed addresses may be stored in look-up table 630 and accessed as they are needed.

FIG. 6 shows one embodiment of channel interleaver 118, which may also be implemented in other manners. Channel deinterleaver 160 at receiver 150 in FIG. 2 may be implemented using the structure shown in FIG. 6.

The pruned bit reversal interleaver may be used in combination with various types of FEC codes, such as a Turbo code, a convolutional code, an LDPC code, and so on. Several exemplary embodiments of encoder 116, channel interleaver 118, and puncturing unit 120 for different FEC codes are described below.

Figure 7:
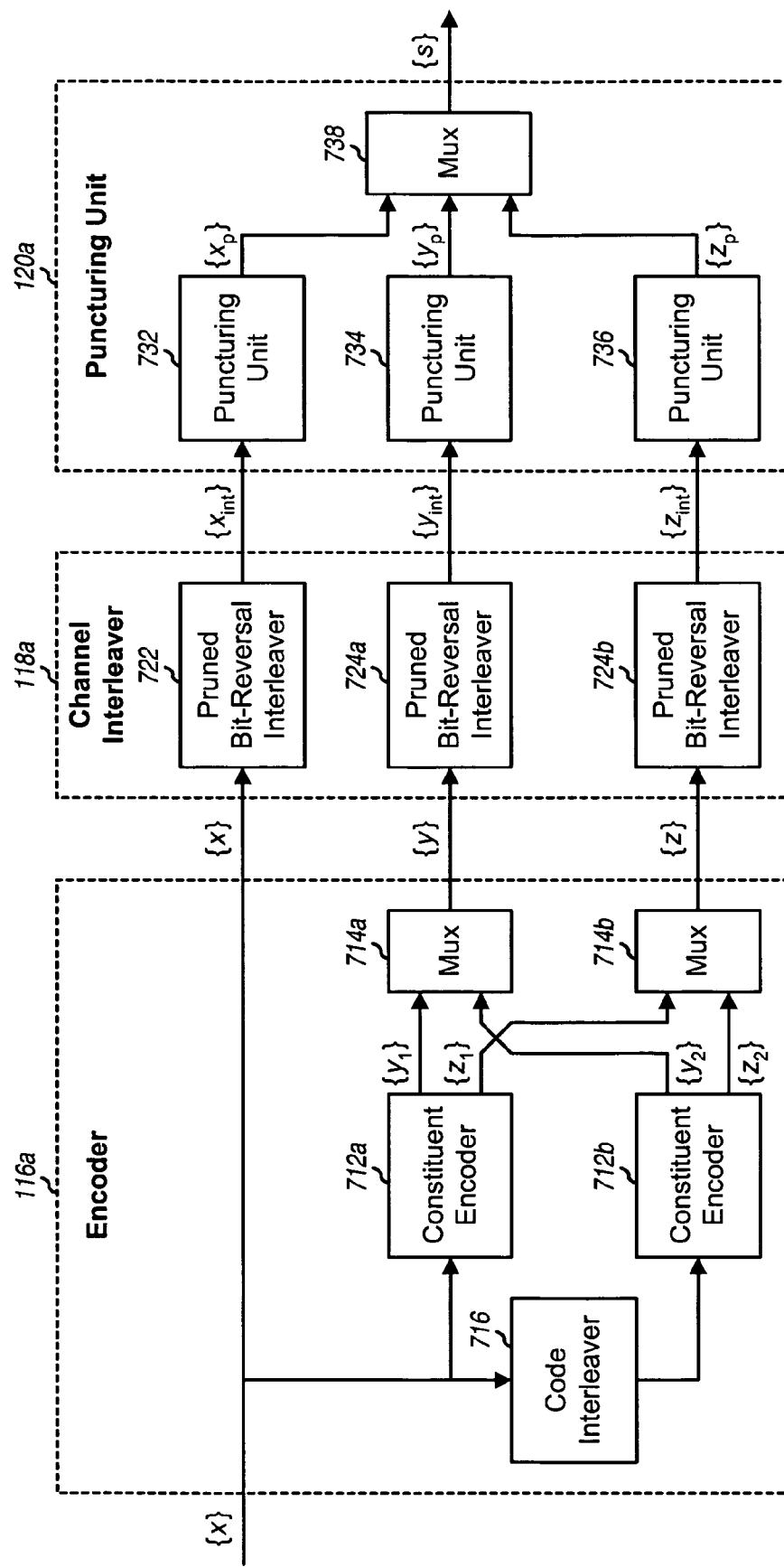
FIG. 7 shows a Turbo encoder with a pruned bit-reversal interleaver.

FIG. 7 shows a block diagram of an encoder 116a, a channel interleaver 118a, and a puncturing unit 120a, which are one embodiment of encoder 116, channel interleaver 118, and puncturing unit 120, respectively, at transmitter 110 in FIG. 1. For this embodiment, encoder 116a implements a rate 1/5 parallel-concatenated convolutional code, which is commonly called a Turbo code. Encoder 116a provides five code bits for each data bit.

Encoder 116a includes two constituent encoders 712a and 712b, two multiplexers (Mux) 714a and 714b, and a code interleaver 716. Encoder 116a receives a data packet containing $N_D$ data bits, which is denoted as $\{x\}$, and provides the $N_D$ data bits as a sequence of $N_D$ systematic bits for the coded packet. Constituent encoder 712a receives the data bits $\{x\}$, encodes the data bits in accordance with a first generator polynomial $G_1(D)$, and generates a first sequence of $N_D$ parity bits, which is denoted as $\{y_1\}$. Constituent encoder 712a also encodes the same data bits in accordance with a second generator polynomial $G_2(D)$ and generates a second sequence of $N_D$ parity bits, which is denoted as $\{z_1\}$. Code interleaver 716 receives and interleaves the $N_D$ data bits in accordance with a particular interleaving scheme. For example, code interleaver 716 may implement an LCS interleaving scheme, a pseudo-random interleaving scheme, and so on, as is known in the art. Constituent encoder 712b receives the $N_D$ interleaved bits from code interleaver 716, encodes the interleaved bits in accordance with the first generator polynomial $G_1(D)$, and generates a third sequence of $N_D$ parity bits, which is denoted as $\{y_2\}$. Constituent encoder 712b also encodes the same interleaved bits in accordance with the second generator polynomial $G_2(D)$ and generates a fourth sequence of $N_D$ parity bits, which is denoted as $\{z_2\}$. Constituent encoders 712a and 712b may also provide tail parity bits.

Multiplexer 714a receives the parity bit sequences $\{y_1\}$ and $\{y_2\}$, multiplexes these two sequences together, and provides a parity bit sequence $\{y\}$ for the first generator polynomial $G_1(D)$. The first $N_D$ parity bits in sequence $\{y\}$ are from sequence $\{y_1\}$, and the last $N_D$ parity bits in sequence $\{y\}$ are from sequence $\{y_2\}$. Similarly, multiplexer 714b receives the parity bit sequences $\{z_1\}$ and $\{z_2\}$, multiplexes these two sequences together, and provides a parity bit sequence $\{z\}$ for the second generator polynomial $G_2(D)$. The first $N_D$ parity bits in sequence $\{z\}$ are from sequence $\{z_1\}$, and the last $N_D$ parity bits in sequence $\{z\}$ are from sequence $\{z_2\}$.

For the data packet with $N_D$ input bits, encoder 116a provides the sequence of $N_D$ systematic bits (which are equal to the $N_D$ input bits), the sequence of $2N_D$ parity bits $\{y\}$ generated with the first generator polynomial, and the sequence of $2N_D$ parity bits $\{z\}$ generated with the second generator polynomial. The sequence of systematic bits and the two sequences of parity bits together make up the $5N_D$ code bits of a coded packet generated by encoder 116a for the data packet.

Channel interleaver 118a includes pruned bit-reversal interleavers 722, 724a, and 724b, each of which may be implemented as shown in FIG. 6. Interleaver 722 performs pruned bit-reversal interleaving on the sequence of $N_D$ systematic bits $\{x\}$ and provides an interleaved sequence $\{x_{int}\}$. Interleaver 722 utilizes a bit-reversal interleaver of size $N'_D$, which is the nearest power of two that is equal to or greater than $N_D$. Interleaver 724a performs pruned bit-reversal interleaving on the sequence of $2N_D$ parity bits $\{y\}$ and provides an interleaved sequence $\{y_{int}\}$. Interleaver 724a utilizes a bit-reversal interleaver of size $2N'_D$, which is the nearest power of two that is equal to or greater than $2N_D$. Similarly, interleaver 724b performs pruned bit-reversal interleaving on the sequence of $2N_D$ parity bits $\{z\}$ and provides an interleaved sequence $\{z_{int}\}$. Interleaver 724b also utilizes a bit-reversal interleaver of size $2N'_D$. Because the sequence $\{y\}$ contains $N_D$ parity bits from sequence $\{y_1\}$ followed by $N_D$ parity bits from sequence $\{y_2\}$, the even-indexed parity bits in $\{y_{int}\}$ are from $\{y_1\}$ and the odd-indexed parity bits in $\{y_{int}\}$ are from $\{y_2\}$. Similarly, the even-indexed parity bits in $\{z_{int}\}$ are from $\{z_1\}$ and the odd-indexed parity bits in $\{z_{int}\}$ are from $\{z_2\}$. The three sequences $\{x_{int}\}$, $\{y_{int}\}$, and $\{z_{int}\}$ form the interleaved packet.

Puncturing unit 120a includes puncturing units 732, 734, and 736 and a multiplexer 738. Puncturing unit 732 receives sequence $\{x_{int}\}$, punctures zero or more code bits, and provides a punctured sequence $\{x_p\}$. Puncturing unit 734 receives sequence $\{y_{int}\}$, punctures or truncates zero or more code bits at the end of sequence $\{y_{int}\}$, and provides a punctured sequence $\{y_p\}$. Similarly, puncturing unit 736 receives sequence $\{z_{int}\}$, punctures zero or more code bits at the end of sequence $\{z_{int}\}$, and provides a punctured sequence $\{z_p\}$. For pruned bit-reversal interleaver 734 and 736, the code bits in each sequence are punctured starting at the end of the sequence and traversing toward the start of the sequence. The interleaved systematic bits in sequence $\{x_{int}\}$ are typically not punctured or are punctured last.

Encoder 116a implements a rate 1/5 Turbo code that generates $N_C=5N_D$ code bits for $N_D$ data bits in the packet. The number of code bits to puncture may be determined by the coded packet size and the output packet size. If the desired output packet size is $N_P$ and the coded packet size is $N_C$, then $(N_C-N_P)$ code bits are punctured to obtain an output packet of size $N_P$. Alternatively, the number of code bits to puncture may be determined by the size of the coded packet and the desired code rate, which is given as $R=N_D/N_P$. If the coded packet size is $N_C$ and the desired code rate is R, then $(N_C-N_D/R)$ code bits are punctured to obtain the desired code rate. For example, a code rate of 1/3 may be obtained by puncturing $(N_C-3N_D)=2N_D$ code bits.

The puncturing may be performed in various manners. In one puncturing scheme, to puncture $(N_C-N_P)$ code bits to generate an output packet of size of $N_P$, the code bits in sequence $\{z_{int}\}$ are punctured first, then the code bits in sequence $\{y_{int}\}$ are punctured next if needed, and the code bits in sequence $\{x_{int}\}$ are punctured last if needed. A rate 1/3 Turbo code is obtained when all $2N_D$ code bits in sequence $\{z_{int}\}$ are punctured. In another puncturing scheme, $(N_C-N_P)/2$ code bits in sequence $\{y_{int}\}$ and $(N_C-N_P)/2$ code bits in sequence $\{z_{int}\}$ are punctured to obtain an output packet of size $N_P$. In any case, multiplexer 738 receives the three sequences $\{x_p\}$, $\{y_p\}$, and $\{z_p\}$, provides sequence $\{x_p\}$, then sequence $\{y_p\}$, and then sequence $\{z_p\}$ last for the output packet, which is denoted as $\{s\}$.

Channel interleaver 118a provides regular puncturing patterns for the parity bits for many code rates, including rates 4/5, 2/3, 1/2, 1/3, 1/4 and 1/5. Channel interleaver 118a provides approximately regular puncturing patterns for other code rates. Channel interleaver 118a also provides good spreading property, as described above. A Turbo decoder can achieve improved performance with the regular or approximately regular puncturing patterns and the good spreading factor provided by channel interleaver 118a.

The puncturing may also be combined with the channel interleaving so that bits that are to be unpunctured are not stored in memory. For a given pruned bit-reversal interleaver, if only K interleaved bits from the interleaver are to be provided for the output packet, then code bits with indices greater than K in the interleaved sequence may be deleted by the interleaver.

FIG. 7 shows encoder 118a implementing a rate 1/5 Turbo code. For a rate 1/3 Turbo code, constituent encoder 712a generates a single sequence of parity bits $\{y_1\}$ based on a single generator polynomial G(D), and constituent encoder 712b also generates a single sequence of parity bits $\{y_2\}$ based on the same generator polynomial G(D). Multiplexer 714a multiplexes sequences $\{y_1\}$ and $\{y_2\}$ into a single sequence $\{y\}$. Pruned bit-reversal interleaver 724a interleaves the parity bits in sequence $\{y\}$ and provides an interleaved sequence $\{y_{int}\}$. Multiplexer 714b, pruned bit-reversal interleaver 724b, and puncturing unit 736 are not needed for the rate 1/3 Turbo code.

Figure 8:
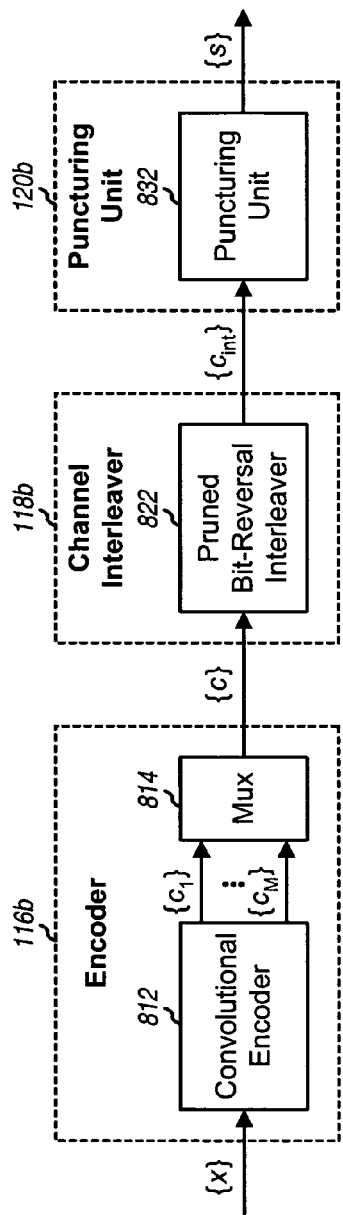
FIG. 8 shows a convolutional encoder with a pruned bit-reversal interleaver.

FIG. 8 shows a block diagram of an encoder 116b, a channel interleaver 118b, and a puncturing unit 120b, which are another embodiment of encoder 116, channel interleaver 118, and puncturing unit 120, respectively, at transmitter 110. For this embodiment, encoder 116b implements a rate 1/M convolutional code that provides M code bits for each data bit. Encoder 116b includes a convolutional encoder 812 and a multiplexer 814. Convolutional encoder 812 receives the data bits $\{x\}$, encodes the data bits in accordance with M different generator polynomials, and generates M sequences of code bits, which are denoted as $\{c_1\}$ through $\{c_M\}$. Multiplexer 814 receives the M code bit sequences, provides sequence $\{c_1\}$ first, then sequence $\{c_2\}$ next, and so on, and then sequence $\{c_M\}$ last for the coded packet, which is denoted as $\{c\}$. This multiplexing scheme ensures that approximately equal number of code bits from each generator polynomial is selected for the output packet.

Channel interleaver 118b includes a pruned bit-reversal interleaver 822 that may be implemented as shown in FIG. 6. Interleaver 822 performs pruned bit-reversal interleaving on the code bit sequence $\{c\}$ and provides an interleaved sequence $\{c_{int}\}$. Interleaver 822 utilizes a bit-reversal interleaver of a size that is the nearest power of two greater than or equal to the input sequence size. The interleaved sequence $\{c_{int}\}$ forms the interleaved packet. Puncturing unit 120b includes a puncturing unit 832 that punctures zero or more code bits in the interleaved sequence $\{c_{int}\}$ (e.g., starting from the end of sequence $\{c_{int}\}$) and provides an output packet $\{s\}$ of the desired size.

Figure 9:
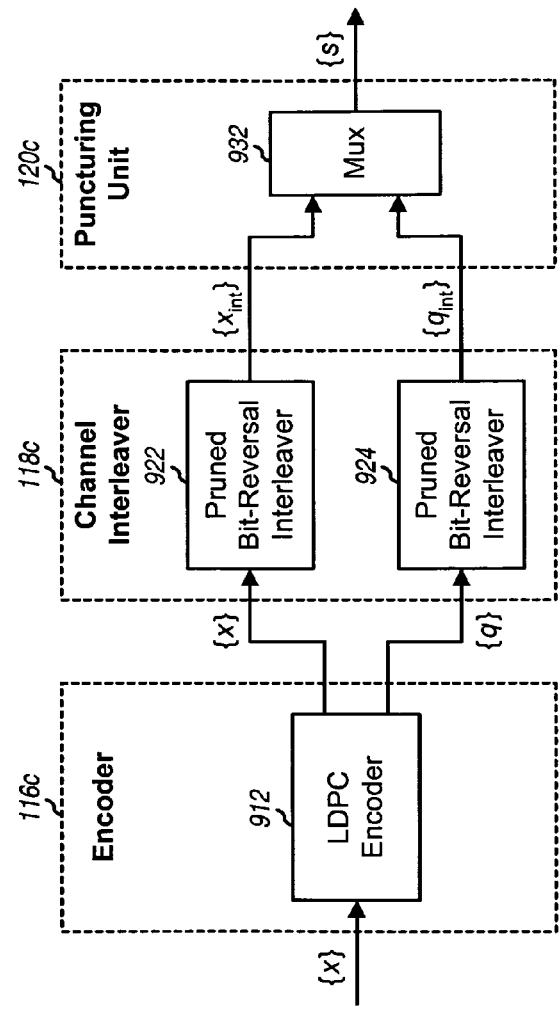
FIG. 9 shows an LDPC encoder with a pruned bit-reversal interleaver.

FIG. 9 shows a block diagram of an encoder 116c, a channel interleaver 118c, and a puncturing unit 120c, which are yet another embodiment of encoder 116, channel interleaver 118, and puncturing unit 120, respectively, at transmitter 110. For this embodiment, encoder 116c includes an LDPC encoder 912. LDPC encoder 912 receives the data bits for a data packet $\{x\}$, encodes the data bits in accordance with a generator matrix G, provides the data bits as a sequence of systematic bits, and provides a sequence of parity bits, which is denoted as $\{q\}$. The generator matrix G is formed based on a parity check matrix H and such that the desired number of code bits is generated. The sequences $\{x\}$ and $\{q\}$ form a coded packet.

Channel interleaver 118c includes pruned bit-reversal interleavers 922 and 924, each of which may be implemented as shown in FIG. 6. Interleaver 922 performs pruned bit-reversal interleaving on the sequence of systematic bits $\{x\}$ and provides an interleaved sequence $\{x_{int}\}$. Interleaver 924 performs pruned bit-reversal interleaving on the sequence of parity bits $\{q\}$ and provides an interleaved sequence $\{q_{int}\}$. Interleavers 922 and 924 utilize bit-reversal interleavers of the smallest possible size for their respective sequences. The sequences $\{x_{int}\}$ and $\{q_{int}\}$ form an interleaved packet. Puncturing unit 120c includes a multiplexer 932 that receives and multiplexes sequences $\{x_{int}\}$ and $\{q_{int}\}$ and provides an output packet $\{s\}$ of the desired size. Since sequences $\{x\}$ and $\{q\}$ are collectively of the desired size, puncturing is not needed.

FIG. 9 shows one type of LDPC code that generates both systematic and parity bits. Other LDPC codes may generate only parity bits and no systematic bits. In this case, the channel interleaving may be performed using one pruned bit-reversal interleaver, in the manner described above in FIG. 8 for the convolutional code.

FIGS. 7, 8, and 9 show the use of the pruned bit-reversal interleaver with three different types of FEC codes. Similar interleavers may be used for other codes where spreading properties and/or regular puncturing patterns are important. The pruned-bit reversal interleaver may be used wherever the properties of a bit-reversal interleaver are desired, but the interleaver size is not a power of two.

For clarity, the interleaving techniques have been described specifically for a pruned bit-reversal interleaver that uses a bit-reversal interleaver having a size that is a power of two. These techniques may also be used for other types of interleaver, such as an LCS-type interleaver, a pseudo-random interleaver, and so on. For example, an LCS-type interleaver or a pseudo-random interleaver of a predetermined size may be used with pruning to support different packet sizes. For any given interleaver of a predetermined size, an input packet may be extended to the interleaver size if it is smaller than the predetermined size (e.g., by appending padding or properly generating addresses). Interleaving may then be performed in the normal manner by the interleaver. The interleaved packet with the original packet size is then formed by pruning (e.g., removing the padding or properly generating addresses). The interleaving techniques may also be used for other interleaver sizes that are not powers of two.

Referring back to FIG. 1, the output bits from puncturing unit 120 are mapped to modulation symbols by symbol mapper 122. For an OFDM-based system, such as an Orthogonal Frequency Division Multiple Access (OFDMA) system, one modulation symbol may be sent on each subband in each OFDM symbol period. A given packet of modulation symbols may be sent on multiple (S) subbands in multiple (T) OFDM symbol periods. For some scenarios, improved performance may be achieved by providing the modulation symbols across time first and then across frequency. In this case, T modulation symbols may be provided to a first subband for T symbol periods, then the next T modulation symbols may be provided to a second subband for the same T symbol periods, and so on. For some other scenarios, improved performance may be achieved by providing the modulation symbols across frequency first and then across time. In this case, S modulation symbols may be provided to the S subbands for a first OFDM symbol period, then the next S modulation symbols may be provided to the S subbands for a second OFDM symbol period, and so on.

The interleaving techniques described herein may be implemented by various means. For example, these techniques may be implemented in hardware, software, or a combination thereof. For a hardware implementation, the processing units used to perform interleaving or deinterleaving may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

For a software implementation, the interleaving techniques may be implemented with modules (e.g., procedures, functions, and so on) that perform the functions described herein. The software codes may be stored in a memory unit (e.g., memory unit 132 in FIG. 1 or memory unit 172 in FIG. 2) and executed by a processor (e.g., controller 130 in FIG. 1 or controller 170 in FIG. 2). The memory unit may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of interleaving data in a communication system, comprising:
   receiving a packet of input data of a first size;
   appending padding to the packet of input data to extend the packet to the second size;
   interleaving the packet of input data in accordance with a linear congruential sequence (LCS) interleaving scheme or a pseudo-random interleaving scheme for the second size; and
   forming a packet of interleaved data of the first size.

2. An apparatus in a wireless communication system, comprising:
   a memory unit operative to receive a packet of input data of a first size and provide a packet of interleaved data of the first size; and
   an address generator operative to generate addresses to interleave the packet of input data in accordance with a bit-reversal interleaving scheme for a second size, the second size being a power of two and greater than the first size.

3. The apparatus of claim 2, further comprising:
   an encoder operative to encode a packet of input data in accordance with a Turbo code, a convolutional code, or a low density parity check (LDPC) code to generate the packet of input data.

4. The apparatus of claim 2, further comprising:
   a puncturing unit operative to delete a portion of the packet of interleaved data to generate a packet of output data.

5. A processor readable media for storing instructions operable to:
   receive a packet of input data of a first size;
   interleave the packet of input data in accordance with a bit-reversal interleaving scheme for a second size, the second size being a power of two and greater than the first size; and
   form a packet of interleaved data of the first size.

6. A method of processing data in a communication system, comprising:
   encoding a sequence of data bits in accordance with a convolutional code to generate a sequence of code bits of a first size;
   appending padding to the packet of input data to extend the packet to the second size;
   interleaving the sequence of code bits in accordance with an interleaving scheme for a second size to generate a sequence of interleaved code bits; and
   forming a packet of interleaved data with the sequence of interleaved code bits.

7. The method of claim 6, wherein the interleaving the sequence of code bits comprises
   interleaving the sequence of code bits in accordance with a bit-reversal interleaving scheme for the second size that is a power of two.

8. The method of claim 6, further comprising:
   deleting a portion of the sequence of interleaved code bits to generate an output packet.

9. A method of processing data in a communication system, comprising:
- encoding a sequence of data bits in accordance with a Turbo code to generate a sequence of systematic bits of a first size, a first sequence of parity bits of a second size, and a second sequence of parity bits of the second size;
- interleaving the sequence of systematic bits in accordance with a bit-reversal interleaving scheme for a first predetermined size to generate a sequence of interleaved systematic bits, wherein the first predetermined size is a power of two and is equal to or greater than the first size;
- interleaving the first sequence of parity bits in accordance with the bit-reversal interleaving scheme for a second predetermined size to generate a first sequence of interleaved parity bits, wherein the second predetermined size is a power of two and is equal to or greater than the second size;
- interleaving the second sequence of parity bits in accordance with the bit-reversal interleaving scheme for the second predetermined size to generate a second sequence of interleaved parity bits; and
- forming a packet of interleaved data with the sequence of interleaved systematic bits and the first and second sequences of interleaved parity bits.

10. The method of claim 9, further comprising:
- deleting a portion of the second sequence of interleaved parity bits, if needed, to generate an output packet.

11. The method of claim 10, further comprising:
- deleting a portion of the first sequence of interleaved parity bits, if needed, to generate the output packet.

12. A method of deinterleaving data in a communication system, comprising:
- obtaining a packet of received data of a first size;
- deinterleaving the packet of received data in accordance with a bit-reversal interleaving scheme for a second size, the second size being a power of two and greater than the first size; and
- forming a packet of deinterleaved data of the first size.

13. The method of claim 12, further comprising:
- inserting erasures in the packet of received data for punctured data.

14. The method of claim 12, further comprising:
- decoding the packet of interleaved data in accordance with a decoding scheme for a Turbo code, a convolutional code, or a low density parity check (LDPC) code to generate a packet of decoded data.

15. An apparatus in a wireless communication system, comprising:
- means for obtaining a packet of received data of a first size;
- means for deinterleaving the packet of received data in accordance with a bit-reversal interleaving scheme for a second size, the second size being a power of two and greater than the first size; and
- means for forming a packet of deinterleaved data of the first size.

16. The apparatus of claim 15, further comprising:
- means for inserting erasures in the packet of received data for punctured data.

17. The apparatus of claim 15, further comprising:
- means for decoding the packet of interleaved data in accordance with a decoding scheme for a Turbo code, a convolutional code, or a low density parity check (LDPC) code to generate a packet of decoded data.

18. A processor configured to execute instructions for performing a method comprising:
- receiving a packet of input data of a first size;
- appending padding to the packet of input data to extend the packet to the second size;
- interleaving the packet of input data in accordance with a linear congruential sequence (LCS) interleaving scheme or a pseudo-random interleaving scheme for the second size; and
- forming a packet of interleaved data of the first size.

* * * * *